United States Patent [19]

Turner

[11] Patent Number: 4,717,829

[45] Date of Patent: Jan. 5, 1988

[54] PLATEN AND BEAM SETUP FLAG ASSEMBLY FOR ION IMPLANTER

[75] Inventor: Norman L. Turner, Gloucester, Mass.

[73] Assignee: Varian Associates, Inc., Palo Alto, Calif.

[21] Appl. No.: 51,269

[22] Filed: May 4, 1987

Related U.S. Application Data

[63] Continuation of Ser. No. 711,687, Mar. 14, 1985, abandoned.

[51] Int. Cl.⁴ .............................................. H01J 37/00
[52] U.S. Cl. ........................... 250/492.2; 250/442.1
[58] Field of Search ............... 250/492.21, 357, 311, 250/442.1; 313/359.1

[56] References Cited

U.S. PATENT DOCUMENTS

| | | | |
|---|---|---|---|
| 3,885,157 | 5/1975 | Heimemann | 250/311 |
| 3,901,183 | 8/1975 | Wittkower | 118/49.1 |
| 3,954,191 | 5/1976 | Wittkower et al. | 214/17 B |
| 4,011,449 | 3/1977 | Ko et al. | 250/492.2 |
| 4,013,891 | 3/1977 | Ko et al. | 250/492.2 |
| 4,234,797 | 11/1980 | Ryding | 250/492.2 |
| 4,282,924 | 8/1981 | Faretra | 165/80 E |
| 4,361,762 | 11/1982 | Douglas | 350/492.2 |
| 4,595,837 | 6/1986 | Wu et al. | 250/492.2 |

OTHER PUBLICATIONS

"DF-3000 Ion Implantation System", Varian, Extrion Division, Brochure, May 1982.

*Primary Examiner*—Bruce C. Anderson
*Attorney, Agent, or Firm*—Stanley Z. Cole; Gerald M. Fisher; Terrence E. Dooher

[57] ABSTRACT

A platen and beam setup assembly for use in an ion implanter includes a platen for wafer mounting and a beam setup flag for beam measurement. The platen and the setup flag are angularly displaced with respect to a common mounting shaft perpendicular to the ion beam. The assembly can be rotated about the shaft between a first position wherein the wafer is exposed to the ion beam and a second position wherein the setup flag is exposed to the ion beam. In a preferred embodiment, the platen is positioned for wafer exchange when the setup flag is exposed to the ion beam.

8 Claims, 3 Drawing Figures

PLATEN AND BEAM SETUP FLAG ASSEMBLY FOR ION IMPLANTER

This application is a continuation of application Ser. No. 711,687, filed Mar. 14, 1985, now abandoned.

BACKGROUND OF THE INVENTION

This invention relates to ion implantation of semiconductor wafers in a vacuum chamber and, more particularly, to an assembly for mounting wafers and for measuring an ion beam.

In the fabrication of integrated circuits, a number of processes have been developed which involve the application of charged particle beams onto semiconductor wafers in vacuum. These processes include ion implantation, ion beam mulling and reactive ion etching. In each instance, a beam of ions is generated in a source and is directed with varying degrees of acceleration towards a target. Ion implanation has become a standard technique for introducing impurity dopants into semiconductor wafers.

Automated ion implantation systems typically include an ion source, ion optics, means for deflecting the ion beam and an end station for mounting and exchanging wafers. The end station includes a platen assembly for mounting a semiconductor wafer in the path of the ion beam, a wafer handler for automatic exchange of wafers and means for measuring the ion beam applied to the wafer. Typically, the wafer is clamped at its periphery to a platen which acts as a heat sink for energy imparted to the wafer by the ion beam. The platen is rotated between an ion implantation position in which it is generally perpendicular to the ion beam and one or more wafer exchange positions where the wafers are unclamped and exchanged. In addition, prior art systems usually include a so-called beam setup flag, which is rotated into the beam path in front of the wafer-mounting platen. The beam setup flag includes a Faraday cup and is used to adjust parameters of the ion beam such as current, focus and centering by measuring the beam current. During implanation of wafers, the beam setup flag is rotated out of the beam path.

In prior art systems, the beam setup flag has been a separately-controlled unit mounted upstream of the platen toward the source. This configuration has several disadvantages. The Faraday charge collection system used for measuring target dosage extends from the platen in the direction of the ion source and encloses the beam setup flag. The length of the beam path and of the Faraday system are increased by the presence of the beam setup flag. In addition, the beam setup flag is not in the wafer plane when the beam is being measured. Therefore, forus in the wafer plane cannot be accurately determined. Furthermore, the beam setup flag requires an actuator, a control system and a cooling system to remove heat. The cooling connections and the electrical connections to the Faraday cup must be made through rotary feedthroughs, since the assembly is mounted for rotation. Therefore, complexity and cost are added to the ion implantation system.

It is a general object of the present invention to provide novel ion implanation apparatus.

It is another object of the present invention to provide a novel platen and beam setup flag assembly for an ion beam processing system.

It is yet another object of the present invention to provide a platen and beam setup flag angularly displaced for rotation about a common mounting shaft.

SUMMARY OF THE INVENTION

In accordance with the present invention, these and other objects and advantages are achieved in apparatus for ion beam processing of a workpiece comprising means for generating an ion beam, a platen and beam set up assembly comprising first means for mounting the workpiece and second means for measurement of the ion beam. The first means and the second means are angularly displaced with respect to a common mounting shaft perpendicular to the ion beam. The apparatus further includes actuation means for rotation of the platen and beam setup assembly about the shaft between a first position wherein the workpiece is exposed to the ion beam and a second position wherein the measurement means is exposed to the ion beam.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
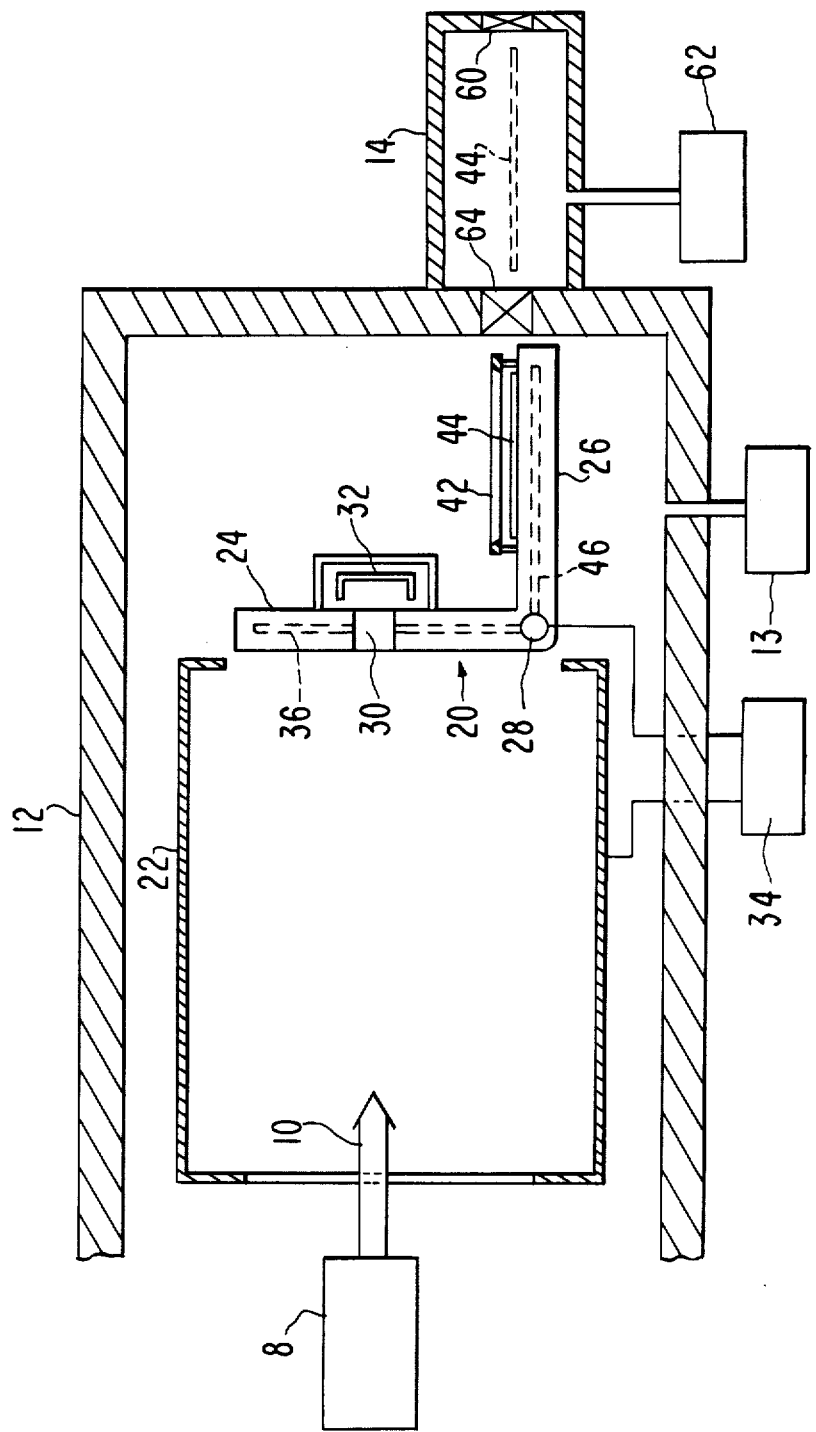
FIG. 1 is a simplified cross-sectional diagram of the apparatus in accordance with the present invention shown in the beam setup position.
Figure 2:
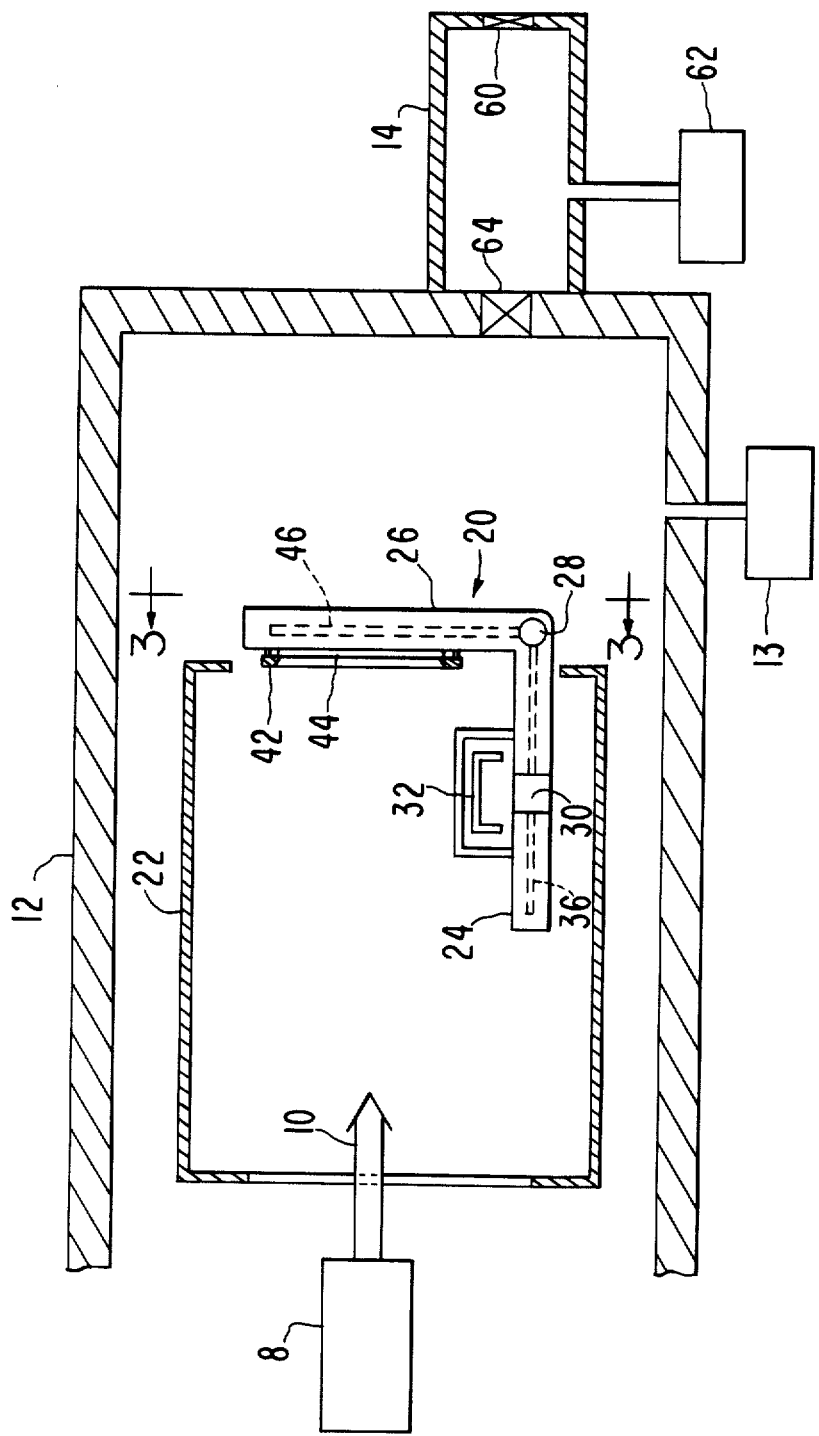
FIG. 2 is a simplified cross-sectional diagram of the apparatus in accordance with the present invention shown in the ion implantation position.
Figure 3:
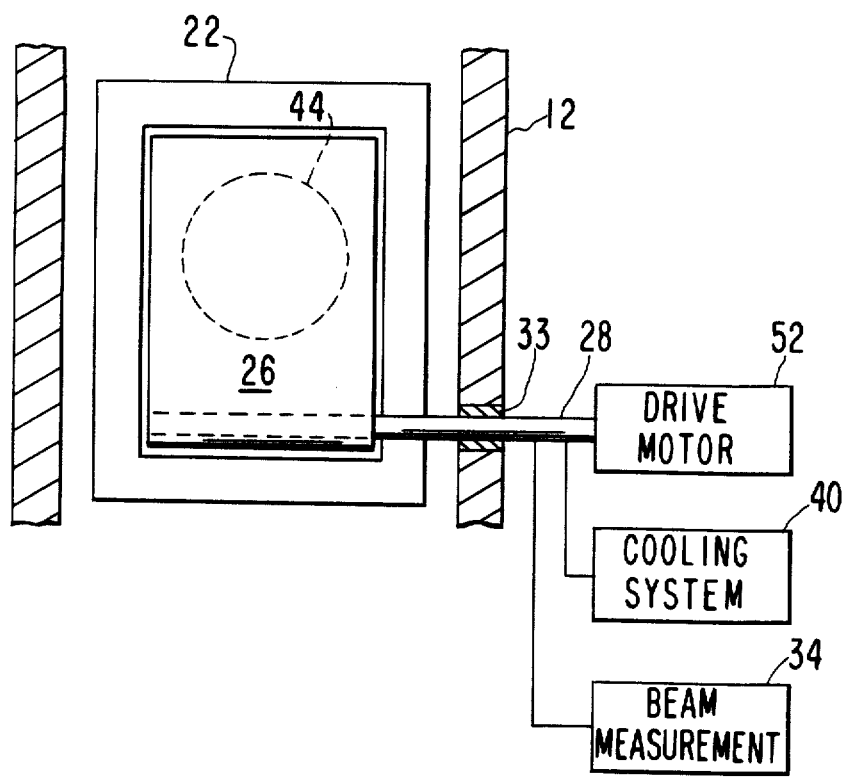
FIG. 3 is an end view of the apparatus of FIG. 2 taken through the line 3—3.

An end station for a serial ion implantation system in accordance with the present invention is shown in simplified form in FIGS. 1-3. An ion beam 10 is generated in an ion source, is accelerated to the desired energy, typically 10-200 KeV, is momentum-analyzed to remove undesired ion species and is focused in the plane of the target wafer. The ion source and ion optical elements are shown schematically at 8. In a serial system which implants one wafer at a time, the ion beam is typically electrostatically scanned over the area of the wafer to provide uniform dosage per unit area. Systems for generating the ion beam 10 are well known in the art and are commercially utilized in ion implantation equipment. The entire region traversed by the ion beam 10 between the source and the wafer is enclosed by a vacuum chamber 12 which is evacuated by a vacuum pump system 13. Semiconductor wafers are introduced into the vacuum chamber 12 through an isolation lock 14, are processed by the ion beam 10 and are removed from the chamber through the isolation lock 14, or a separate exit lock (not shown).

A platen and beam setup assembly 20 is positioned within the vacuum chamber 12 at the downstream end of a Faraday charge collection system 22. The assembly 20 includes a beam setup flag 24 and a wafer holding platen 26, both mounted on a shaft 28, which is perpendicular to the axis of the ion beam 10. The assembly 20 can pivot about the shaft 28. The flag 24 and the platen 26 are angularly displaced with respect to the axis of the shaft 28 by 90° in the present example. A centrally located opening 30 in the flag 24 opens to a Faraday cup 32 which is used to measure the beam 10. The Faraday cup 32 is electrically isolated from the flag 24 and is connected electrically through a rotary feedthrough 33 (FIG. 3) to an external beam measurement system 34. The flag 24 also includes a passage 36 for circulation of a cooling fluid. The passage 36 connects through the rotary feedthrough 33 to an external cooling system 40.

A clamping ring 42 on the platen 26 clamps a semiconductor wafer 44 at its periphery, using mechanical or hydraulic actuation. The wafer 44 is clamped against a heat sink surface which can be contoured as described in copending application Ser. No. 631,527, filed July 18, 1984. Thermal transfer between the wafer 44 and the platen surface can be enchanced by the introduction of a thermal transfer gas, as described in U.S. Pat. No. 4,457,359. The platen includes a passage 46 for circulation of a cooling fluid. The passage 46 is connected to the external cooling system 40.

The assembly 20 is connected by the shaft 28 to a drive motor 52 (FIG. 3) located external to the vacuum chamber 12. The drive motor 52 rotates the assembly 20 between a first position in which the wafer 44 is exposed to the ion beam 10, as shown in FIG. 2, and a second position in which the flag 24 is exposed to the ion beam 10, as shown in FIG. 1.

In the present example, the second position, wherein the flag 24 is exposed to the ion beam 10, also positions the platen 26 for wafer exchange, as shown in FIG. 1. The wafer exchanger can utilize a wafer shuttle, a mechanical wafer holder or other known wafer handling technique for positioning wafers on the platen 26 and for removing wafers therefrom. The wafer 44 is introduced into the lock 14 through a vacuum valve 60. The valve 60 is closed and the lock 14 is evacuated by a vacuum pump 62 connected to the lock 14. A vacuum valve 64 between the lock 14 and the chamber 12 is then opened and the wafer is transferred to the platen 26.

In operation, the beam setup flag 24 is first positioned in the path of the ion beam, as shown in FIG. 1. The ion beam 10 is focused by measurement of current using the Faraday cup 32. The beam 10 current is adjusted to the desired level by measuring the total current in the Faraday cup 32 and Faraday system 22. In addition, centering and other parameters of the ion beam can be adjusted. It will be understood that the flag 24 can include beam sensors located at prescribed positions on the beam flag 24. During the setup operation, the cooling system 40 circulates a cooling fluid through the passage 36 to remove heat generated by impingement of the ion beam 10. Simultaneously with the setup process, a wafer 44 can be positioned on the platen 26. The assembly 20 is then rotated counter-clockwise by 90° to position the platen 26 and the wafer 44 in the path of the ion beam, as shown in FIG. 2. The wafer 44 is implanted to the desired doping level as determined by the Faraday system 22 and associated dose measurement system (not shown). During implantation, the cooling system 40 circulates the cooling fluid through the passage 46 to remove heat generated by impingement of the ion beam 10. Since the ion beam does not impinge on the platen 26 and the flag 24 at the same time, the load on the cooling system 40 is relatively constant. After implantation of the wafer 44 is complete, the assembly 20 is rotated back to the initial setup position and the wafer 44 is exchanged. The beam setup parameters may be checked and adjusted when necessary.

The platen and beam setup assembly 20 has been described hereinabove as having two possible positions and an angular displacement of 90° between the beam setup flag and the platen. It will be understood that other configurations are encompassed within the scope of the present invention. For example, the Varian Wayflow ® wafer handling system employs a gravity feed and gravity eject technique for wafer exchange (see U.S. Pat. No. 3,901,183). The platen is rotated to an oblique upward angle and the wafer slides by gravity from an entrance isolation lock onto the platen where it is clamped. The platen is rotated to a vertical position for implantation and then is rotated to a downward oblique angle for ejection. The wafer slides by gravity from the platen into an exit isolation lock. In this configuration the platen and beam setup assembly 20 has a beam setup position, an implant position, a wafer-receive position and a wafer-eject position. Furthermore, the beam setup flag 24 and the platen 26 are not necessarily displaced by 90°. In the implant position, the platen can be tilted by a few degrees to inhibit channeling of implanted ions. However, angular displacement of approximately 90° is most practical to prevent shadowing of one element by the other. Those skilled in the art will recognize that the cooling system 40 and the cooling fluid passages 36,46 can be omitted when heating by the beam 10 is relatively small.

While there has been shown and described what is at present considered the preferred embodiments of the invention, it will be obvious to those skilled in the art that various changes and modifications may be made therein without departing from the scope of the invention as defined by the appended claims.

I claim:

1. Apparatus for ion beam processing of a workpiece comprising:

means for generating an ion beam;

a first stationary current collection means;

an assembly comprising means for mounting said workpiece and a second current collection means angularly displaced from said means for mounting about a shaft perpendicular to said ion beam, said assembly being rotatable about the axis of said shaft between at least a first position wherein a workpiece mounted on said means for mounting is exposed to said ion beam and a second position wherein said second current collection means is exposed to said ion beam; and means for measuring the total current collected by said first and said second current collection means.

2. The apparatus as defined in claim 1 wherein said means for mounting includes a platen for clamping a semiconductor wafer at its periphery, said platen including a passage for circulation of a cooling fluid.

3. The apparatus as defined in claim 3 wherein said second position of said assembly is adapted for exchange of wafers to and from said platen.

4. The apparatus as defined in claim 1 wherein said means for mounting and said second current collection means are angularly displaced by approximately 90° on said shaft.

5. The apparatus as defined in claim 1 wherein said second current collection means is centrally located with respect to the axis of said ion beam when said assembly is in said second position.

6. The apparatus as defined in claim 1 wherein said means for mounting and said second current collection means are exposed to said ion beam in substantially the same plane.

7. The apparatus as defined in claim 1 wherein said first stationary current collection means comprises a Faraday system.

8. The apparatus as defined in claim 7 wherein said second current collection means comprises a Faraday cup.

* * * * *

UNITED STATES PATENT AND TRADEMARK OFFICE
CERTIFICATE OF CORRECTION

PATENT NO. : 4,717,829
DATED : Jan. 5, 1988
INVENTOR(S) : Norman L. Turner

It is certified that error appears in the above-identified patent and that said Letters Patent are hereby corrected as shown below:

In line 1 of claim 3, delete "claim 3" and insert --claim 2--.

Signed and Sealed this

Seventh Day of June, 1988

Attest:

DONALD J. QUIGG

*Attesting Officer*

*Commissioner of Patents and Trademarks*